United States Patent
Sharma et al.

(10) Patent No.: US 9,450,143 B2
(45) Date of Patent: Sep. 20, 2016

(54) GALLIUM AND NITROGEN CONTAINING TRIANGULAR OR DIAMOND-SHAPED CONFIGURATION FOR OPTICAL DEVICES

(75) Inventors: Rajat Sharma, Fremont, CA (US); Andrew Felker, Fremont, CA (US); Aurelien J.F. David, San Francisco, CA (US)

(73) Assignee: Soraa, Inc., Fremont, CA (US)

( * ) Notice: Subject to any disclaimer, the term of this patent is extended or adjusted under 35 U.S.C. 154(b) by 408 days.

(21) Appl. No.: 13/357,578

(22) Filed: Jan. 24, 2012

(65) Prior Publication Data
US 2013/0026483 A1 Jan. 31, 2013

Related U.S. Application Data

(63) Continuation-in-part of application No. 13/163,482, filed on Jun. 17, 2011, now Pat. No. 8,293,551.

(60) Provisional application No. 61/436,115, filed on Jan. 25, 2011, provisional application No. 61/356,473, filed on Jun. 18, 2010.

(51) Int. Cl.
*H01L 31/0256* (2006.01)
*H01L 29/15* (2006.01)
*H01L 33/00* (2010.01)
*H01L 33/20* (2010.01)

(52) U.S. Cl.
CPC .......... *H01L 33/0095* (2013.01); *H01L 33/20* (2013.01)

(58) Field of Classification Search
CPC .................................................. H01L 33/025
USPC ........................................................... 257/76
See application file for complete search history.

(56) References Cited

U.S. PATENT DOCUMENTS

| | | | |
|---|---|---|---|
| 3,647,522 | A | 3/1972 | Single |
| 4,065,688 | A | 12/1977 | Thornton |
| 4,870,045 | A | 9/1989 | Gasper et al. |
| 5,331,654 | A | 7/1994 | Jewell et al. |
| 5,366,953 | A | 11/1994 | Char et al. |
| 5,607,899 | A | 3/1997 | Yoshida et al. |
| 5,632,812 | A | 5/1997 | Hirabayashi |
| 5,685,885 | A | 11/1997 | Khandros et al. |
| 5,764,674 | A | 6/1998 | Hibbs-Brenner et al. |
| 5,813,753 | A | 9/1998 | Vriens et al. |
| 5,926,493 | A | 7/1999 | O'Brien et al. |

(Continued)

FOREIGN PATENT DOCUMENTS

| | | |
|---|---|---|
| EP | 0961328 | 12/1999 |
| EP | 2381490 | 10/2011 |

(Continued)

OTHER PUBLICATIONS

Cich et al., 'Bulk GaN based violet light-emitting diodes with high efficiency at very high current density', Applied Physics Letters, 101, Nov. 29, 2012, pp. 223509-1-223509-3.

(Continued)

*Primary Examiner* — Matthew Landau
*Assistant Examiner* — Igwe U Anya
(74) *Attorney, Agent, or Firm* — Saul Ewing LLP

(57) ABSTRACT

A gallium and nitrogen containing optical device has a base region and no more than three major planar side regions configured in a triangular arrangement provided from the base region.

22 Claims, 6 Drawing Sheets

(56) References Cited

U.S. PATENT DOCUMENTS

| | | | |
|---|---|---|---|
| 6,069,394 A | 5/2000 | Hashimoto et al. |
| 6,072,197 A | 6/2000 | Horino et al. |
| 6,147,953 A | 11/2000 | Duncan |
| 6,195,381 B1 | 2/2001 | Botez et al. |
| 6,335,771 B1 | 1/2002 | Hiraishi |
| 6,379,985 B1 | 4/2002 | Cervantes et al. |
| 6,498,355 B1 | 12/2002 | Harrah et al. |
| 6,501,154 B2 | 12/2002 | Morita et al. |
| 6,509,651 B1 | 1/2003 | Matsubara et al. |
| 6,533,874 B1 | 3/2003 | Vaudo et al. |
| 6,547,249 B2 | 4/2003 | Collins, III et al. |
| 6,586,762 B2 | 7/2003 | Kozaki |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,809,781 B2 | 10/2004 | Setlur et al. |
| 6,858,882 B2 | 2/2005 | Tsuda et al. |
| 6,860,628 B2 | 3/2005 | Robertson et al. |
| 6,936,488 B2 | 8/2005 | D'Evelyn et al. |
| 6,956,246 B1 | 10/2005 | Epler et al. |
| 7,009,199 B2 | 3/2006 | Hall |
| 7,012,279 B2 | 3/2006 | Wierer, Jr. et al. |
| 7,019,325 B2 | 3/2006 | Li et al. |
| 7,128,849 B2 | 10/2006 | Setlur et al. |
| 7,285,801 B2 | 10/2007 | Eliashevich et al. |
| 7,303,630 B2 | 12/2007 | Motoki et al. |
| 7,341,880 B2 | 3/2008 | Erchak et al. |
| 7,348,600 B2 * | 3/2008 | Narukawa et al. ............. 257/79 |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,419,281 B2 | 9/2008 | Porchia et al. |
| 7,470,555 B2 | 12/2008 | Matsumura |
| 7,470,938 B2 | 12/2008 | Lee et al. |
| 7,483,466 B2 | 1/2009 | Uchida et al. |
| 7,489,441 B2 | 2/2009 | Scheible et al. |
| 7,491,984 B2 | 2/2009 | Koike et al. |
| 7,518,159 B2 | 4/2009 | Masui et al. |
| 7,566,639 B2 | 7/2009 | Kohda |
| 7,598,104 B2 | 10/2009 | Teng et al. |
| 7,622,742 B2 | 11/2009 | Kim et al. |
| 7,733,571 B1 | 6/2010 | Li |
| 7,772,585 B2 * | 8/2010 | Uematsu et al. ............. 257/13 |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,923,741 B1 | 4/2011 | Zhai et al. |
| 7,976,630 B2 | 7/2011 | Poblenz et al. |
| 8,044,412 B2 | 10/2011 | Murphy et al. |
| 8,142,566 B2 | 3/2012 | Kiyomi et al. |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| D662,899 S | 7/2012 | Shum et al. |
| D662,900 S | 7/2012 | Shum et al. |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,269,245 B1 | 9/2012 | Shum |
| 8,293,551 B2 * | 10/2012 | Sharma et al. ............... 438/33 |
| 8,299,473 B1 | 10/2012 | D'Evelyn et al. |
| 8,304,265 B2 | 11/2012 | Nakamura et al. |
| 8,310,143 B2 | 11/2012 | Van De Ven et al. |
| 8,314,429 B1 | 11/2012 | Raring et al. |
| 8,324,835 B2 | 12/2012 | Shum et al. |
| 8,350,273 B2 | 1/2013 | Vielemeyer |
| 8,351,478 B2 | 1/2013 | Raring et al. |
| 8,355,418 B2 | 1/2013 | Raring et al. |
| 8,455,894 B1 | 6/2013 | D'Evelyn et al. |
| 8,477,259 B2 | 7/2013 | Kubota et al. |
| 8,502,465 B2 | 8/2013 | Katona et al. |
| 8,524,578 B1 | 9/2013 | Raring et al. |
| 8,575,728 B1 | 11/2013 | Raring et al. |
| 8,597,967 B1 | 12/2013 | Krames et al. |
| 8,686,431 B2 | 4/2014 | Batres et al. |
| 8,786,053 B2 | 7/2014 | D'Evelyn et al. |
| 8,791,499 B1 | 7/2014 | Sharma et al. |
| 2001/0009134 A1 | 7/2001 | Kim et al. |
| 2001/0043042 A1 | 11/2001 | Murazaki et al. |
| 2001/0048114 A1 | 12/2001 | Morita et al. |
| 2001/0055208 A1 | 12/2001 | Kimura |
| 2002/0027933 A1 | 3/2002 | Tanabe et al. |
| 2002/0050488 A1 | 5/2002 | Nikitin et al. |
| 2002/0070416 A1 | 6/2002 | Morse et al. |
| 2002/0096994 A1 | 7/2002 | Iwafuchi et al. |
| 2002/0105986 A1 | 8/2002 | Yamasaki |
| 2002/0127824 A1 | 9/2002 | Shelton et al. |
| 2002/0155691 A1 | 10/2002 | Lee et al. |
| 2002/0182768 A1 | 12/2002 | Morse et al. |
| 2002/0190260 A1 | 12/2002 | Shen et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0045042 A1 * | 3/2003 | Biwa et al. ............... 438/200 |
| 2003/0047076 A1 | 3/2003 | Liu |
| 2003/0080345 A1 * | 5/2003 | Motoki et al. ............. 257/103 |
| 2003/0164507 A1 | 9/2003 | Edmond et al. |
| 2003/0178617 A1 | 9/2003 | Appenzeller et al. |
| 2003/0216011 A1 | 11/2003 | Nakamura et al. |
| 2004/0051107 A1 * | 3/2004 | Nagahama ............. B82Y 20/00 257/79 |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0109486 A1 * | 6/2004 | Kinoshita ........... H01S 5/32341 372/45.01 |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0196877 A1 | 10/2004 | Kawakami et al. |
| 2004/0207998 A1 | 10/2004 | Suehiro et al. |
| 2004/0238810 A1 * | 12/2004 | Dwilinski ............. B82Y 20/00 257/12 |
| 2004/0245543 A1 | 12/2004 | Yoo |
| 2004/0251471 A1 | 12/2004 | Dwilinski et al. |
| 2005/0001227 A1 * | 1/2005 | Niki et al. ............... 257/98 |
| 2005/0012446 A1 | 1/2005 | Jermann et al. |
| 2005/0045894 A1 * | 3/2005 | Okuyama et al. ............. 257/95 |
| 2005/0082544 A1 * | 4/2005 | Narukawa ............. B82Y 20/00 257/79 |
| 2005/0087753 A1 | 4/2005 | D'Evelyn et al. |
| 2005/0109240 A1 | 5/2005 | Maeta et al. |
| 2005/0121679 A1 | 6/2005 | Nagahama et al. |
| 2005/0140270 A1 | 6/2005 | Henson et al. |
| 2005/0167680 A1 | 8/2005 | Shei et al. |
| 2005/0199899 A1 | 9/2005 | Lin et al. |
| 2005/0214992 A1 | 9/2005 | Chakraborty et al. |
| 2005/0224830 A1 | 10/2005 | Blonder et al. |
| 2005/0230701 A1 | 10/2005 | Huang |
| 2005/0232327 A1 | 10/2005 | Nomura et al. |
| 2005/0263791 A1 | 12/2005 | Yanagihara et al. |
| 2006/0038542 A1 | 2/2006 | Park et al. |
| 2006/0060131 A1 | 3/2006 | Atanackovic |
| 2006/0060872 A1 | 3/2006 | Edmond et al. |
| 2006/0077795 A1 | 4/2006 | Kitahara et al. |
| 2006/0079082 A1 | 4/2006 | Bruhns et al. |
| 2006/0118799 A1 | 6/2006 | D'Evelyn et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0186418 A1 | 8/2006 | Edmond et al. |
| 2006/0189098 A1 | 8/2006 | Edmond |
| 2006/0204865 A1 | 9/2006 | Erchak et al. |
| 2006/0205199 A1 | 9/2006 | Baker et al. |
| 2006/0213429 A1 | 9/2006 | Motoki et al. |
| 2006/0214287 A1 | 9/2006 | Ogihara et al. |
| 2006/0255343 A1 | 11/2006 | Ogihara et al. |
| 2006/0256482 A1 | 11/2006 | Araki et al. |
| 2006/0273339 A1 | 12/2006 | Steigerwald et al. |
| 2006/0288928 A1 | 12/2006 | Eom et al. |

(56) References Cited

U.S. PATENT DOCUMENTS

| | | |
|---|---|---|
| 2007/0045200 A1 | 3/2007 | Moon et al. |
| 2007/0054476 A1 | 3/2007 | Nakahata et al. |
| 2007/0062440 A1 | 3/2007 | Sato et al. |
| 2007/0072324 A1 | 3/2007 | Krames et al. |
| 2007/0093073 A1 | 4/2007 | Farrell, Jr. et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0164292 A1* | 7/2007 | Okuyama ............... H01L 33/20 257/79 |
| 2007/0202624 A1 | 8/2007 | Yoon et al. |
| 2007/0210074 A1 | 9/2007 | Maurer et al. |
| 2007/0217462 A1 | 9/2007 | Yamasaki |
| 2007/0228404 A1 | 10/2007 | Tran et al. |
| 2007/0231978 A1 | 10/2007 | Kanamoto et al. |
| 2007/0264733 A1 | 11/2007 | Choi et al. |
| 2007/0280320 A1 | 12/2007 | Feezell et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0121913 A1 | 5/2008 | McKenzie et al. |
| 2008/0128752 A1 | 6/2008 | Wu |
| 2008/0142781 A1 | 6/2008 | Lee |
| 2008/0164489 A1 | 7/2008 | Schmidt et al. |
| 2008/0164578 A1 | 7/2008 | Tanikella et al. |
| 2008/0173884 A1 | 7/2008 | Chitnis et al. |
| 2008/0179607 A1 | 7/2008 | DenBaars et al. |
| 2008/0179610 A1 | 7/2008 | Okamoto et al. |
| 2008/0191192 A1 | 8/2008 | Feezell et al. |
| 2008/0191223 A1 | 8/2008 | Nakamura et al. |
| 2008/0194054 A1 | 8/2008 | Lin et al. |
| 2008/0198881 A1 | 8/2008 | Farrell et al. |
| 2008/0210958 A1 | 9/2008 | Senda et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0261381 A1 | 10/2008 | Akiyama et al. |
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2009/0028204 A1 | 1/2009 | Hiroyama et al. |
| 2009/0032828 A1 | 2/2009 | Romano et al. |
| 2009/0058532 A1 | 3/2009 | Kikkawa et al. |
| 2009/0065798 A1 | 3/2009 | Masui et al. |
| 2009/0071394 A1 | 3/2009 | Nakahata et al. |
| 2009/0072252 A1 | 3/2009 | Son et al. |
| 2009/0078944 A1 | 3/2009 | Kubota et al. |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0095973 A1 | 4/2009 | Tanaka et al. |
| 2009/0140279 A1 | 6/2009 | Zimmerman et al. |
| 2009/0146170 A1 | 6/2009 | Zhong et al. |
| 2009/0155989 A1* | 6/2009 | Uematsu et al. ............. 438/507 |
| 2009/0194796 A1 | 8/2009 | Hashimoto et al. |
| 2009/0206354 A1 | 8/2009 | Kitano et al. |
| 2009/0227056 A1 | 9/2009 | Kyono et al. |
| 2009/0250686 A1 | 10/2009 | Sato et al. |
| 2009/0252191 A1 | 10/2009 | Kubota et al. |
| 2009/0267098 A1 | 10/2009 | Choi |
| 2009/0267100 A1 | 10/2009 | Miyake et al. |
| 2009/0273005 A1 | 11/2009 | Lin |
| 2009/0309110 A1 | 12/2009 | Raring et al. |
| 2009/0309127 A1 | 12/2009 | Raring et al. |
| 2009/0315480 A1 | 12/2009 | Yan et al. |
| 2009/0321745 A1 | 12/2009 | Kinoshita et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0006876 A1* | 1/2010 | Moteki et al. .................. 257/95 |
| 2010/0025656 A1 | 2/2010 | Raring et al. |
| 2010/0032691 A1 | 2/2010 | Kim |
| 2010/0055819 A1 | 3/2010 | Ohba et al. |
| 2010/0067241 A1 | 3/2010 | Lapatovich et al. |
| 2010/0096615 A1 | 4/2010 | Okamoto et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0140634 A1 | 6/2010 | van de Ven et al. |
| 2010/0148145 A1 | 6/2010 | Ishibashi et al. |
| 2010/0149814 A1 | 6/2010 | Zhai et al. |
| 2010/0155746 A1 | 6/2010 | Ibbetson et al. |
| 2010/0195687 A1 | 8/2010 | Okamoto et al. |
| 2010/0200837 A1 | 8/2010 | Zimmerman et al. |
| 2010/0219505 A1 | 9/2010 | D'Evelyn |
| 2010/0220262 A1 | 9/2010 | DeMille et al. |
| 2010/0240158 A1 | 9/2010 | Ter-Hovhannissian |
| 2010/0264446 A1* | 10/2010 | Niki ...................... H01L 33/007 257/98 |
| 2010/0276663 A1 | 11/2010 | Enya et al. |
| 2010/0290208 A1 | 11/2010 | Pickard |
| 2010/0295054 A1 | 11/2010 | Okamoto et al. |
| 2010/0295088 A1 | 11/2010 | D'Evelyn et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2011/0017298 A1 | 1/2011 | Lee |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0062415 A1 | 3/2011 | Ohta et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1 | 3/2011 | Ohta et al. |
| 2011/0075694 A1 | 3/2011 | Yoshizumi et al. |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0103418 A1 | 5/2011 | Hardy et al. |
| 2011/0108081 A1 | 5/2011 | Werthen et al. |
| 2011/0121331 A1 | 5/2011 | Simonian et al. |
| 2011/0124139 A1 | 5/2011 | Chang |
| 2011/0175200 A1 | 7/2011 | Yoshida |
| 2011/0177631 A1* | 7/2011 | Gardner et al. ................. 438/26 |
| 2011/0180781 A1 | 7/2011 | Raring et al. |
| 2011/0182056 A1 | 7/2011 | Trottier et al. |
| 2011/0186860 A1 | 8/2011 | Enya et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0204378 A1* | 8/2011 | Su et al. .......................... 257/76 |
| 2011/0216795 A1 | 9/2011 | Hsu et al. |
| 2011/0220912 A1 | 9/2011 | D'Evelyn |
| 2011/0247556 A1 | 10/2011 | Raring et al. |
| 2011/0256693 A1 | 10/2011 | D'Evelyn et al. |
| 2011/0262773 A1 | 10/2011 | Poblenz et al. |
| 2011/0266552 A1 | 11/2011 | Tu et al. |
| 2011/0279054 A1 | 11/2011 | Katona et al. |
| 2011/0281422 A1 | 11/2011 | Wang et al. |
| 2011/0315999 A1 | 12/2011 | Sharma et al. |
| 2011/0317397 A1 | 12/2011 | Trottier et al. |
| 2012/0000415 A1 | 1/2012 | D'Evelyn et al. |
| 2012/0007102 A1 | 1/2012 | Feezell et al. |
| 2012/0043552 A1 | 2/2012 | David et al. |
| 2012/0073494 A1 | 3/2012 | D'Evelyn |

(56) References Cited

U.S. PATENT DOCUMENTS

| | | |
|---|---|---|
| 2012/0091465 A1 | 4/2012 | Krames et al. |
| 2012/0104412 A1 | 5/2012 | Zhong et al. |
| 2012/0118223 A1 | 5/2012 | D'Evelyn |
| 2012/0135553 A1 | 5/2012 | Felker et al. |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199841 A1 | 8/2012 | Batres et al. |
| 2012/0199952 A1 | 8/2012 | D'Evelyn et al. |
| 2012/0235201 A1 | 9/2012 | Shum |
| 2012/0288974 A1 | 11/2012 | Sharma et al. |
| 2013/0016750 A1 | 1/2013 | Raring et al. |
| 2013/0022064 A1 | 1/2013 | Raring et al. |
| 2013/0022758 A1 | 1/2013 | Trottier |
| 2013/0044782 A1 | 2/2013 | Raring |
| 2013/0064261 A1 | 3/2013 | Sharma et al. |
| 2013/0112987 A1 | 5/2013 | Fu et al. |
| 2013/0126902 A1 | 5/2013 | Isozaki et al. |
| 2013/0234108 A1 | 9/2013 | David et al. |
| 2014/0103356 A1 | 4/2014 | Krames et al. |
| 2014/0175492 A1 | 6/2014 | Steranka et al. |
| 2014/0346524 A1 | 11/2014 | Batres et al. |
| 2014/0346546 A1 | 11/2014 | D'Evelyn et al. |

FOREIGN PATENT DOCUMENTS

| | | |
|---|---|---|
| JP | 06-334215 | 12/1994 |
| JP | 1997-036430 | 2/1997 |
| JP | 1997-082587 | 3/1997 |
| JP | 11-340507 | 12/1999 |
| JP | 1999-340507 | 12/1999 |
| JP | 1999-340576 | 12/1999 |
| JP | 2001-160627 | 6/2001 |
| JP | 2001-177146 | 6/2001 |
| JP | 2002-185085 | 6/2002 |
| JP | 2003-031844 | 1/2003 |
| JP | 2000-294883 | 2/2004 |
| JP | 2006-173621 | 6/2006 |
| JP | 2007-110090 | 4/2007 |
| JP | 2008-084973 | 4/2008 |
| JP | 2008-172040 | 7/2008 |
| JP | 2008-311640 | 12/2008 |
| JP | 2009-21824 | 1/2009 |
| WO | WO 2006/062880 | 6/2006 |
| WO | WO 2009/001039 | 12/2008 |
| WO | WO 2010/138923 | 2/2010 |

OTHER PUBLICATIONS

USPTO Notice of Allowance for U.S. Appl. No. 12/720,593 dated Jul. 11, 2012.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/749,476 dated Jun. 26, 2012.
USPTO Office Action for U.S. Appl. No. 12/861,765 dated Jul. 2, 2012.
USPTO Office Action for U.S. Appl. No. 12/880,889 dated Sep. 19, 2012.
USPTO Office Action for U.S. Appl. No. 12/936,238 dated Aug. 30, 2012.
USPTO Office Action for U.S. Appl. No. 13/465,976 dated Aug. 16, 2012.
Iso et al., 'High Brightness Blue InGaN/GaN Light Emitting Diode on Nonpolar m-Plane Bulk GaN Substrate,' Japanese Journal of Applied Physics, 2007, vol. 46, No. 40, pp. L960-L962.
USPTO Office Action for U.S. Appl. No. 12/569,841 dated Dec. 23, 2011.
USPTO Office Action for U.S. Appl. No. 12/569,844 dated Oct. 12, 2012.
USPTO Notice of Allowance for U.S. Appl. No. 12/569,844 dated Mar. 7, 2013.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
USPTO Office Action for U.S. Appl. No. 12/861,765 dated Mar. 7, 2013.
USPTO Office Action for U.S. Appl. No. 12/936,238 dated Jan. 30, 2013.
USPTO Office Action for U.S. Appl. No. 13/025,833 dated Jul. 12, 2012.
USPTO Office Action for U.S. Appl. No. 13/179,346 dated Aug. 17, 2012.
USPTO Office Action for U.S. Appl. No. 13/179,346 dated Dec. 13, 2012.
Motoki et al., 'Dislocation reduction in GaN crystal by advanced-DEEP', Journal of Crystal Growth, vol. 305, Apr. 1, 2007, pp. 377-383.
USPTO Office Action for U.S. Appl. No. 12/569,841 dated Feb. 14, 2014, 20 pages.
USPTO Office Action for U.S. Appl. No. 13/012,674 dated Jan. 17, 2014, 15 pages.
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
Hanifin et al., 'Photoreception for Circadian, Neuroendocrine, and Neurobehavioral Regulation', Journal of Physiological Anthropology, vol. 26, 2007, pp. 87-94.
International Search Report & Written Opinion of PCT Application No. PCT/US2013/029453, dated Jul. 25, 2013, 11 pages total.
http://www.philipslumileds.com/products/luxeon-flash, 'LUXEON Flash', Philips Lumileds, Aug. 8, 2013, pp. 1-2.
Rea et al., 'White Lighting', COLOR Research and Application, vol. 38, No. 2, Sep. 3, 2011, pp. 82-92.
USPTO Office Action for U.S. Appl. No. 12/569,841 dated Aug. 13, 2013, 21 pages.
USPTO Office Action for U.S. Appl. No. 12/861,765 dated Sep. 17, 2013, 10 pages.
USPTO Office Action for U.S. Appl. No. 13/281,221 dated Jun. 21, 2013, 6 pages.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.
Communication from the Korean Patent Office re 10-2012-7009980, dated Apr. 15, 2013.
USPTO Office Action for U.S. Appl. No. 12/569,841 dated Mar. 26, 2013.
USPTO Office Action for U.S. Appl. No. 12/749,466 dated Jul. 3, 2012.
USPTO Notice of Allowance for U.S. Appl. No. 12/936,238 dated Apr. 16, 2013.
USPTO Office Action for U.S. Appl. No. 13/019,897 dated Jan. 16, 2013.
USPTO Office Action for U.S. Appl. No. 13/328,978 dated May 15, 2013.
USPTO Office Action for U.S. Appl. No. 13/465,976 dated Dec. 20, 2012.
International Search Report for PCT application PCT/US2011/41106 (Jan. 5, 2012).
Aguilar, 'Ohmic n-contacts to Gallium Nitride Light Emitting Diodes', National Nanotechnolghy Infrastructure Network, 2007, p. 56-81.
Baker et al., 'Characterization of Planar Semipolar Gallium Nitride Films on Spinel Substrates', Japanese Journal of Applied Physics, vol. 44, No. 29, 2005, p. L920-L922.

(56) References Cited

OTHER PUBLICATIONS

Founta et al., 'Anisotropic Morphology of Nonpolar a-Plane GaN Quantum Dots and Quantum Wells', Journal of Applied Physics, vol. 102, vol. 7, 2007, p. 074304-1-074304-6.
Lu et al., 'Etch-Pits of GaN Films with Different Etching Methods', Journal of the Korean Physical Society, vol. 45, Dec. 2004, p. S673-S675.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Sato et al., 'High Power and High Efficiency Semipolar InGaN Light Emitting Diodes', Journal of Light and Visible Environment, vol. 32, No. 2, Dec. 13, 2007, p. 57-60.
Sato et al., 'Optical Properties of Yellow Light-Emitting Diodes Grown on Semipolar (1122) Bulk GaN Substrate', Applied Physics Letters, vol. 92, No. 22, 2008, p. 221110-1-221110-3.
Selvanathan et al., 'Investigation of Surface Treatment Schemes on n-type GaN and Al0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
Communication from the Japanese Patent Office re 2012-529969, dated Oct. 15, 2013, (6 pages).
Weaver et al., 'Optical Properties of Selected Elements', Handbook of Chemistry and Physics, 94th Edition, 2013-2014, p. 12-126-12-150.
USPTO Office Action for U.S. Appl. No. 12/491,169 dated Oct. 22, 2010 (9 pages).
USPTO Office Action for U.S. Appl. No. 12/491,169 dated May 11, 2011 (9 pages).
USPTO Office Action for U.S. Appl. No. 12/497,289 dated Feb. 2, 2012 (6 pages).
USPTO Notice of Allowance for U.S. Appl. No. 12/497,289 dated May 22, 2012 (7 pages).
USPTO Office Action for U.S. Appl. No. 12/785,953 dated Apr. 12, 2012 (11 pages).
USPTO Office Action for U.S. Appl. No. 12/785,953 dated Jan. 11, 2013 (14 pages).
USPTO Office Action for U.S. Appl. No. 12/785,953 dated Oct. 3, 2013 (10 pages).
USPTO Office Action for U.S. Appl. No. 12/880,803 dated Feb. 22, 2012 (8 pages).
USPTO Notice of Allowance for U.S. Appl. No. 12/880,803 dated Jul. 18, 2012 (5 pages).
USPTO Office Action for U.S. Appl. No. 12/995,946 dated Jan. 29, 2013 (25 pages).
USPTO Office Action for U.S. Appl. No. 12/995,946 dated Aug. 2, 2013 (15 pages).
USPTO Office Action for U.S. Appl. No. 13/019,897 dated Dec. 2, 2013 (17 pages).
USPTO Notice of Allowance for U.S. Appl. No. 13/281,221 dated Nov. 12, 2013 (10 pages).
USPTO Office Action for U.S. Appl. No. 13/328,978 dated Sep. 26, 2013 (25 pages).
USPTO Office Action for U.S. Appl. No. 13/548,635 dated Jun. 14, 2013 (5 pages).
USPTO Notice of Allowance for U.S. Appl. No. 13/548,635 dated Sep. 16, 2013 (6 pages).
USPTO Office Action for U.S. Appl. No. 13/548,770 dated Mar. 12, 2013 (5 pages).
USPTO Notice of Allowance for U.S. Appl. No. 13/548,770 dated Jun. 25, 2013 (6 pages).
USPTO Office Action for U.S. Appl. No. 13/629,366 dated Oct. 31, 2013 (7 pages).
USPTO Office Action for U.S. Appl. No. 13/723,968 dated Nov. 29, 2013 (23 pages).
Mastro et al., 'Hydride vapor phase epitaxy-grown AlGaN/GaN high electron mobility transistors', Solid-State Electronics, vol. 47, Issue 6, Jun. 2003, pp. 1075-1079.
Morkoc, 'Handbook of Nitride Semiconductors and Devices', vol. 1, 2008, p. 704.
USPTO Office Action for U.S. Appl. No. 13/014,622 dated Jun. 20, 2014 (15 pages).
USPTO Notice of Allowance for U.S. Appl. No. 13/304,182 dated Aug. 27, 2014 (8 pages).
USPTO Office Action for U.S. Appl. No. 13/465,976 dated Aug. 25, 2014 (21 pages).
USPTO Office Action for U.S. Appl. No. 13/553,691 dated Sep. 17, 2014 (14 pages).
USPTO Office Action for U.S. Appl. No. 14/054,234 dated Aug. 14, 2014 (24 pages).
Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, p. L761-L763.
Feezell et al., 'AlGaN-Cladding-Free Nonpolar InGaN/GaN Laser Diodes', Japanese Journal of Applied Physics, vol. 46, No. 13, 2007, p. L284-L286.
Haskell et al., 'Defect Reduction in (1100) m-plane gallium nitride via lateral epitaxial overgrowth by hydride vapor phase epitaxy', Applied Physics Letters 86, 111917, 2005, p. 1-3.
Kojima et al., 'Stimulated Emission at 474 nm From an InGaN Laser Diode Structure Grown on a (1122) GaN Substrate', Applied Physics Letters, vol. 91, 2007, p. 251107-251107-3.
Kubota et al., 'Temperature Dependence of Polarized Photoluminescence From Nonpolar m-Plane InGaN Multiple Quantum Wells for Blue Laser Diodes', Applied Physics Letter, vol. 92, 2008, p. 011920-1-011920-3.
PCT Communication Including Partial Search and Examination Report for PCT/US2011/041106, dated Oct. 4, 2011, 4 pages total.
International Search Report of PCT Application No. PCT/US2011/041106, dated Jan. 5, 2012, 4 pages total.
Tsuda et al., 'Blue Laser Diodes Fabricated on m-Plane GaN Substrates', Applied Physics Express, vol. 1, 2008, pp. 011104-1-011104-3.
Tyagi et al., 'Semipolar (1011) InGaN/GaN Laser Diodes on Bulk GaN Substrates', Japanese Journal of Applied Physics, vol. 46, No. 19, 2007, p. L444-L445.
USPTO Office Action for U.S. Appl. No. 12/478,736 dated Feb. 7, 2012 (6 pages).
USPTO Office Action for U.S. Appl. No. 12/481,543 dated Jun. 27, 2011 (9 pages).
USPTO Office Action for U.S. Appl. No. 12/634,665 dated Mar. 12, 2012 (9 pages).
USPTO Notice of Allowance for U.S. Appl. No. 12/785,953 dated Mar. 20, 2014 (8 pages).
USPTO Office Action for U.S. Appl. No. 12/861,765 dated Mar. 28, 2014 (12 pages).
USPTO Office Action for U.S. Appl. No. 12/879,784 dated Jan. 25, 2012 (6 pages).
USPTO Notice of Allowance for U.S. Appl. No. 12/879,784 dated Apr. 3, 2012 (7 pages).
USPTO Office Action for U.S. Appl. No. 12/880,889 dated Feb. 27, 2012 (12 pages).
USPTO Office Action for U.S. Appl. No. 12/995,946 dated Mar. 28, 2012 (17 pages).
USPTO Notice of Allowance for U.S. Appl. No. 13/012,674 dated Apr. 30, 2014 (8 pages).
USPTO Office Action for U.S. Appl. No. 13/014,622 dated Nov. 28, 2011 (13 pages).
USPTO Office Action for U.S. Appl. No. 13/014,622 dated Apr. 30, 2012 (13 pages).
USPTO Office Action for U.S. Appl. No. 13/019,897 dated Mar. 30, 2012 (14 pages).
USPTO Office Action for U.S. Appl. No. 13/019,897 dated Jun. 12, 2014 (8 pages).
USPTO Notice of Allowance for U.S. Appl. No. 13/163,482 dated Jul. 31, 2012 (5 pages).
USPTO Office Action for U.S. Appl. No. 13/304,182 dated May 9, 2014 (12 pages).

(56) References Cited

OTHER PUBLICATIONS

USPTO Office Action for U.S. Appl. No. 13/629,366 dated Apr. 18, 2014 (7 pages).
Enya, '531nm Green Lasing of InGaN Based Laser Diodes on Semi-Polar {20-21} Free-Standing GaN Substrates', Applied Physics Express, Jul. 17, 2009, vol. 2, pp. 082101.
Fujii et al., 'Increase in the Extraction Efficiency of GaN-Based Light-Emitting Diodes Via Surface Roughening', 2Applied Physics Letters, vol. 84, No. 6, 2004, pp. 855-857.
Kendall et al., 'Energy Savings Potential of Solid State Lighting in General Lighting Applications', Report for the Department of Energy, 2001, pp. 1-35.
International Search Report of PCT Application No. PCT/US2011/023622, dated Apr. 1, 2011, 2 pages total.
International Preliminary Report & Written Opinion of PCT Application No. PCT/US2011/037792, dated Dec. 6, 2012, 8 pages total.
Schmidt et al., 'High Power and High External Efficiency m-Plane InGaN Light Emitting Diodes', Japanese Journal of Applied Physics, vol. 46, No. 7, 2007, pp. L126-L128.
Shchekin et al., 'High Performance Thin-film Flip-Chip InGaN—GaN Light-Emitting Diodes', Applied Physics Letters, vol. 89, 2006, pp. 071109-1-071109-3.
Tyagi et al., 'High Brightness Violet InGaN/GaN Light Emitting Diodes on Semipolar (1011) Bulk GaN Substrates', Japanese Journal of Applied Physics, vol. 46, No. 7, 2007, pp. L129-L131.
Communication from the German Patent Office re 11 2010 003 697.7 dated Apr. 11, 2013, (6 pages).
Communication from the Japanese Patent Office re 2012-529905 dated Apr. 19, 2013, (4 pages).
Communication from the Chinese Patent Office re 201180029188.7 dated Sep. 29, 2014 (7 pages).
Communication from the Japanese Patent Office re 2013-515583 dated Sep. 12, 2014 (4 pages).
Wierer et al., 'High-Power AlGaInN Flip-Chip Light-Emitting Diodes', Applied Physics Letters, vol. 78, No. 22, 2001, pp. 3379-3381.
Yamaguchi, 'Anisotropic Optical Matrix Elements in Strained GaN-Quantum Wells With Various Substrate Orientations', Physica Status Solidi (PSS), vol. 5, No. 6, 2008, pp. 2329-2332.
Yoshizumi et al., 'Continuous-Wave Operation of 520nm Green InGaN-Based Laser Diodes on Semi-Polar {2021} GaN Substrates', Applied Physics Express, vol. 2, 2009, pp. 092101-1-092101-3.
USPTO Office Action for U.S. Appl. No. 12/883,652 dated Jan. 11, 2013 (11 pages).
USPTO Office Action for U.S. Appl. No. 12/942,817 dated Feb. 20, 2013 (11 pages).
USPTO Office Action for U.S. Appl. No. 13/019,897 dated Dec. 5, 2014 (18 pages).
USPTO Notice of Allowance for U.S. Appl. No. 13/108,645 dated Jan. 28, 2013 (8 pages).
USPTO Office Action for U.S. Appl. No. 13/291,922 dated Feb. 20, 2013 (9 pages).
USPTO Notice of Allowance for U.S. Appl. No. 13/425,304 dated Aug. 22, 2012 (7 pages).
USPTO Office Action for U.S. Appl. No. 13/425,354 dated Feb. 14, 2013 (12 pages).
USPTO Office Action for U.S. Appl. No. 13/606,894 dated Feb. 5, 2013 (7 pages).
USPTO Office Action for U.S. Appl. No. 14/181,386 dated Oct. 28, 2014 (10 pages).
USPTO Notice of Allowance for U.S. Appl. No. 14/301,520 dated Nov. 25, 2014 (8 pages).

* cited by examiner

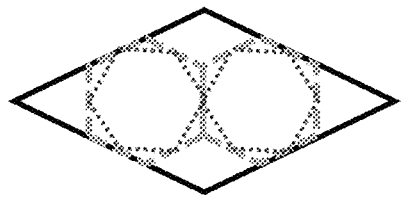
Figure 5
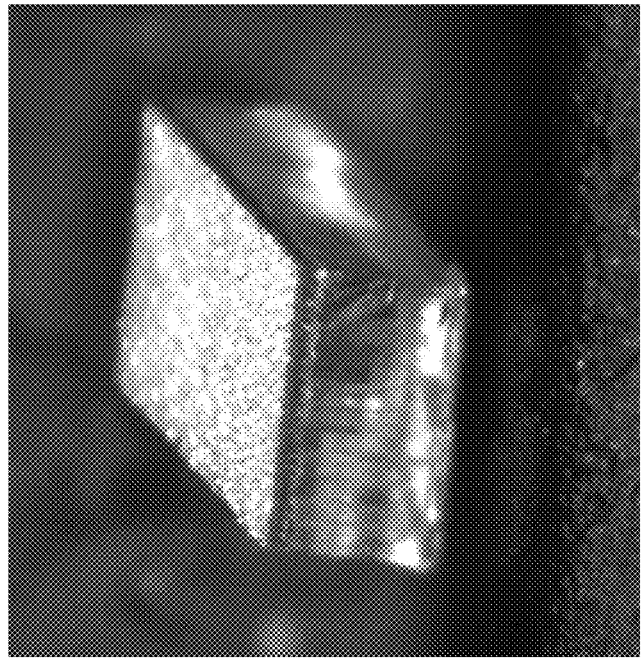
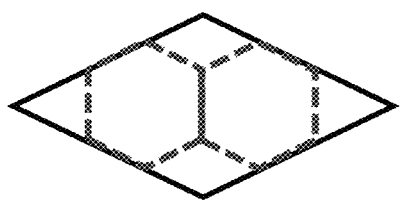
Figure 4
Figure 6

GALLIUM AND NITROGEN CONTAINING TRIANGULAR OR DIAMOND-SHAPED CONFIGURATION FOR OPTICAL DEVICES

CROSS REFERENCE TO RELATED APPLICATIONS

This application claims priority to U.S. Provisional Application No. 61/436,155, filed Jan. 25, 2011; and is a continuation-in-part of U.S. application Ser. No. 13/163,432, filed Jun. 17, 2011; which claims priority to U.S. Provisional Application No. 61/356,473, filed Jun. 10, 2010, all of which are incorporated herein by reference for all purposes.

BACKGROUND OF THE INVENTION

This invention relates generally to lighting techniques. More specifically, embodiments of the invention include techniques for manufacturing optical devices, such as light emitting diodes (LEDs) using a separation process of thick gallium and nitrogen containing substrate members, such as GaN configured in polar crystalline orientations. In some embodiments, the gallium and nitrogen containing substrate is configured in a triangular shape or a diamond shape. The invention can be applied to applications such as white lighting, multi-colored lighting, general illumination, decorative lighting, automotive and aircraft lamps, street lights, lighting for plant growth, indicator lights, lighting for flat panel displays, and other optoelectronic devices.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates more than 90% of the energy used as thermal energy. Additionally, the conventional light bulb routinely fails often due to thermal expansion and contraction of the filament element.

Solid state lighting techniques are known. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. Additionally, GaN based LEDs have been costly and difficult to produce on a wide-scale in an efficient manner.

BRIEF SUMMARY OF THE INVENTION

Conventional LED fabrication process typically employs a wafer scribing and breaking procedure to generate individual LED chips. These wafers are typically scribed along two substantially orthogonal axes, wherein these individual axes are respectively parallel to and co-planar with two non-equivalent crystal plane orientations of the wafer. For example, for an LED wafer comprising GaN on sapphire singulated into square or rectangular chips, the two orthogonal scribe axes are respectively parallel to and co-planar with m-plane and a-plane orientations of the sapphire wafer, wherein the m-planes and a-planes are not equivalent by definition.

In a specific embodiment, the present method includes a scribe and break process for bulk c-plane GaN wafers. The wafers are scribed along two or more non-orthogonal axes. These two or more axes are respectively parallel to and co-planar with equivalent crystal planes of the GaN wafer. For example, a bulk c-plane GaN wafer is scribed along three axes (with an angle of 60° between each of these three axes) wherein these three axes are respectively parallel to and co-planar with three m-plane orientations of the c-plane GaN wafer. In a specific embodiment, the three m-plane orientations are equivalent by definition. In one or more aspects, the present invention includes a method to fabricate a triangular-shaped or diamond-shaped chip geometry in the case of c-plane GaN wafers, which may have several advantages over conventional square or rectangular geometries. This present invention utilizes the in-plane 6-fold rotational symmetry and crystallography unique to c-plane GaN wafers—GaN has the Wurtzite crystal structure according to a specific embodiment. In an alternative preferred embodiment, the bulk c-plane GaN wafer may be scribed along three axes (with an angle of 60 degrees between each of these three axes) wherein these three axes are respectively parallel to and co-planar with three a-plane orientations of the c-plane GaN wafer, the three a-plane orientations being equivalent by definition.

In a specific embodiment, the present invention provides a gallium and nitrogen containing substrate configured in a triangular shape consisting of no more than five surface regions. Preferably, the five surface regions comprise three surface regions configured from respective first equivalent planes and two surface regions configured from second equivalent planes.

In alternative embodiments, the invention provides a diamond shape substrate consisting of no more than six surface regions. Preferably, the six surface regions comprise four surface regions configured from respective first equivalent planes and two surface regions configured from second equivalent planes. A first surface region configured in a c plane orientation and a second surface region configured in the c-plane orientation. The method also includes exposing at least a first m-plane region, a second m-plane region, and a third m-plane region. Moreover, the present invention provides a method of separating die from a gallium and nitrogen containing substrate. The invention also includes a gallium and nitrogen containing optical device. The device includes a gallium and nitrogen containing substrate having a base region and no more than three major planar side regions configured in a triangular arrangement provided from the base region.

In a preferred embodiment, the present method and structure can include one or more of the following elements that can include variations, modifications, and alternatives.

1. A bulk c-plane GaN wafer with an overlying LED epitaxial structure and with p-type and n-type metallizations is fabricated, such that there are 'scribe streets' along three directions (at 60° angles relative to each other) separating individual LED traces on the wafer. The scribe streets are aligned to be respectively parallel to three m-plane orientations of the c-plane GaN wafer, and are designed to intersect such that the triangle shape defined by three scribe lines is an equilateral triangle.

2. The LED wafer is laser-scribed on a first surface of the wafer, along a first 'scribe street' direction. The scribe depth in the scribed regions on the first surface is typically 20-50% of the thickness of the LED wafer.

3. The LED wafer is then laser-scribed on a first surface of the wafer, along a second 'scribe street' direction. The scribe depth in the scribed regions on the first surface is typically 20-50% of the thickness of the LED wafer.

4. The LED wafer is laser-scribed on a first surface of the wafer, along the third 'scribe street' direction. The scribe depth in the scribed regions on the first surface is typically 20-50% of the thickness of the LED wafer.

5. The scribe depth in the scribed regions on the second surface is typically 20-50% of the thickness of the LED wafer.

6. The scribed LED wafer is then broken using an anvil breaker setup along the three 'scribe street' orientations. Breaking occurs along the planes defined by scribed regions on the first surface of the wafer in a specific embodiment. Breaking along the third 'scribe street' orientation yields individual triangle-shaped LED chips.

In a specific embodiment, the invention provides for a method for singulation of thick c-plane GaN wafers into triangle-shaped LED chips defined by three equivalent m-plane oriented sidewalls. In one or more embodiments, the m-plane is a natural break plane, which easily cleaves, in the case of c-plane GaN wafers, and therefore, a singulation process involving breaking exclusively or predominately along a set of m-plane orientations will have a higher yield than a process involving breaking along both m-plane orientations and a-plane orientations. In another specific embodiment, the present invention provides for a method for singulation of c-plane GaN wafers into triangle-shaped LED chips defined by three equivalent m-plane oriented sidewalls. In one or more embodiments, break along the a-plane yields a characteristic surface texture which results in improved light extraction.

The invention provides triangle-shaped chips characterized by improved light extraction when compared to conventional square- or rectangle-shaped chips, due to an increase in the per-pass probability of escape of in-plane emission arising from a decrease in the probability of total internal reflection at the sidewalls. Additionally, triangle-shaped chips provide fewer trapped trajectories of light than square or rectangle chips, so that the chip light extraction efficiency can be increased.

BRIEF DESCRIPTION OF THE DRAWINGS

FIGS. 4 through 6 are diagrams illustrating a method for forming a diamond shaped gallium and nitrogen containing material.

DETAILED DESCRIPTION OF THE INVENTION

Figure 2:
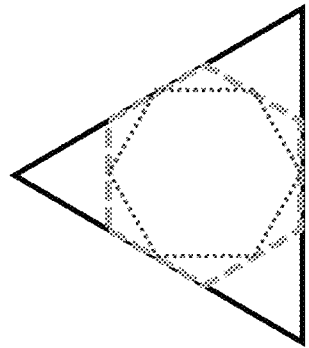
FIGS. 1 through 3 are diagrams illustrating a method for forming triangular shaped gallium and nitrogen containing material.
Figure 1:
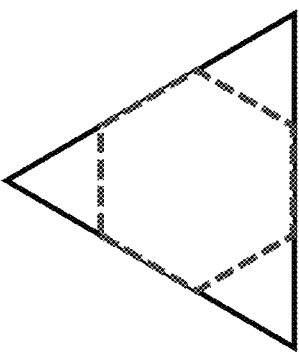
Figure 3:
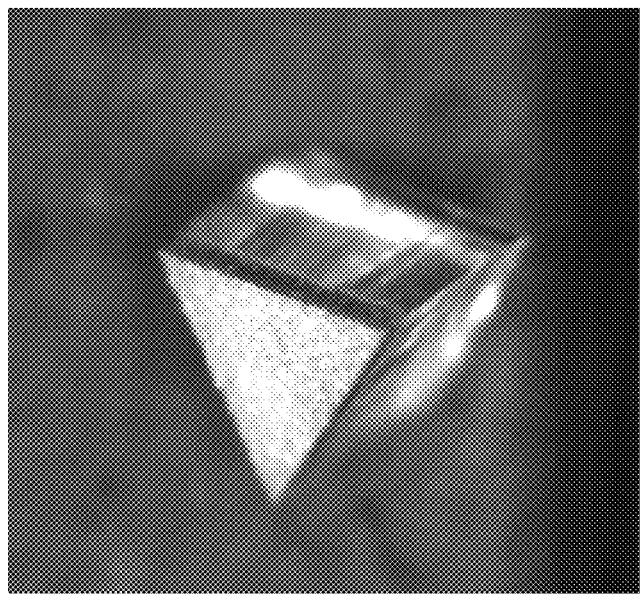

FIGS. 1 through 3 are simplified diagrams illustrating a method for forming a triangular shaped gallium and nitrogen containing material according to an embodiment of the present invention. As shown in FIG. 1, the invention provides a gallium and nitrogen containing substrate member. The member includes a gallium and nitrogen containing thickness of material configured in a triangular shape consisting of no more than five surface regions. Preferably, the five surface regions comprises a three surface regions configured from respective first equivalent planes and the five surface regions excluding the three surface regions comprises two surface regions configured from second equivalent planes. As shown is a top-view of a triangular shaped chip showing orientation of three edges relative to GaN m-planes according to a specific embodiment (see dashed and dotted lines).

In a specific embodiment, the gallium and nitrogen containing substrate is triangular shaped. The triangular shaped substrate may be an extruded triangular shape. In a specific embodiment, the three surface regions of the triangular shaped regions are respective first equivalent planes, which are either m-planes or a-planes, see FIG. 2. The second surface regions of the triangular shaped regions are respective second equivalent planes, which are c-planes. In a specific embodiment, the gallium and nitrogen containing substrate is a GaN substrate. Of course, there can be other variations, modifications, and alternatives.

In a specific embodiment, the three surface regions of the triangular shaped regions are configured from respective scribes provided on respective first equivalent planes. As an example, the three surface regions are configured by an interior region of 180 Degrees or the like. In other examples, the two surface regions are configured in parallel arrangement to each other.

Referring now to FIG. 3, an optical micrograph of a triangular shaped LED chip is illustrated. As shown, the GaN substrate is configured from bulk c-plane GaN having three m-plane surface orientations exposed. As also shown, the gallium and nitrogen containing member comprises at least an optical device thereon in at least one specific embodiment. The optical device can be a light emitting diode, a laser device, or other device, as well as combinations of optical and electrical devices. Other types of devices can include electrical switching devices, mechanical devices, and any combination of these and the like.

FIGS. 4 through 6 are simplified diagrams illustrating a method for forming a triangular shaped gallium and nitrogen containing material according to an embodiment of the present invention. As shown, the substrate shows four edges relative to GaN m-planes (see dashed and dotted lines). The substrate member includes a gallium and nitrogen containing thickness of material configured in a diamond shape consisting of no more than six surface regions. Preferably, the six surface regions comprises four surface regions configured from respective first equivalent planes and the six surface regions excluding the four surface regions comprises two surface regions configured from second equivalent planes.

In a specific embodiment, the substrate that is the diamond shape is free from a 90 degree intersection between any two of the first four surface regions out of the six surface regions. In a specific embodiment, the diamond shape includes the first equivalent planes that are either m-planes or a-planes, as illustrated by FIG. 5. As shown, the four edges are associated with GaN a-planes (dotted or dashed lines). In a specific embodiment, the diamond shape includes the second equivalent planes that are c-planes.

The four surface regions of the diamond shape are configured from respective scribes provided on respective first equivalent planes in a specific embodiment. Preferably, the four surface regions are configured by an interior region free from a 90 degree angle. Preferably, the two surface regions are configured in parallel arrangement to each other.

Referring now to FIG. 6, an optical micrograph of a diamond shaped LED chip is illustrated. As shown, the GaN substrate is configured from bulk c-plane GaN having four m-plane surface orientations exposed. As also shown, the gallium and nitrogen containing member comprises at least an optical device thereon in at least one specific embodiment. The optical device can be a light emitting diode, a laser device, or other device, as well as combinations of optical and electrical devices.

Figure 7:
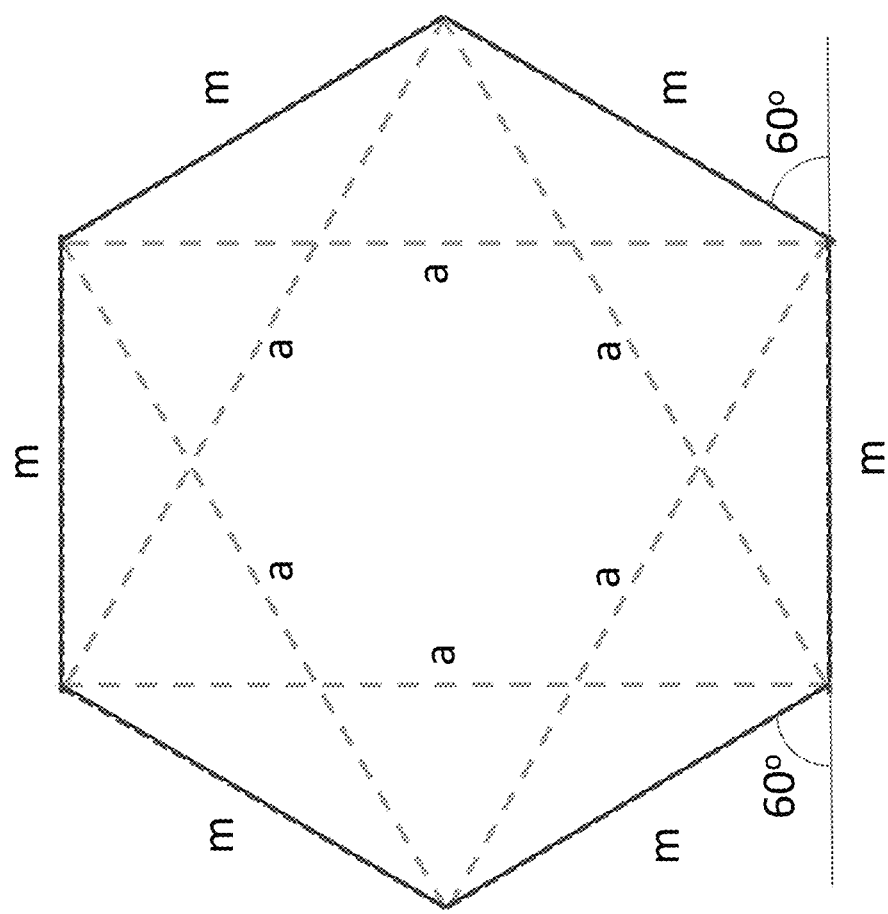
FIG. 7 is a diagram showing relative orientations of m-planes (red lines) and a-planes (green lines), wherein the plane of the diagram represents a c-plane, in the case of the GaN (Wurtzite) crystal structure.

FIG. 7 is a simplified diagram showing relative orientations of m-planes (solid lines) and a-planes (dashed lines), wherein the plane of the diagram represents a c-plane, in the case of the GaN (Wurtzite) crystal structure according to an embodiment of the present invention.

Figure 8:
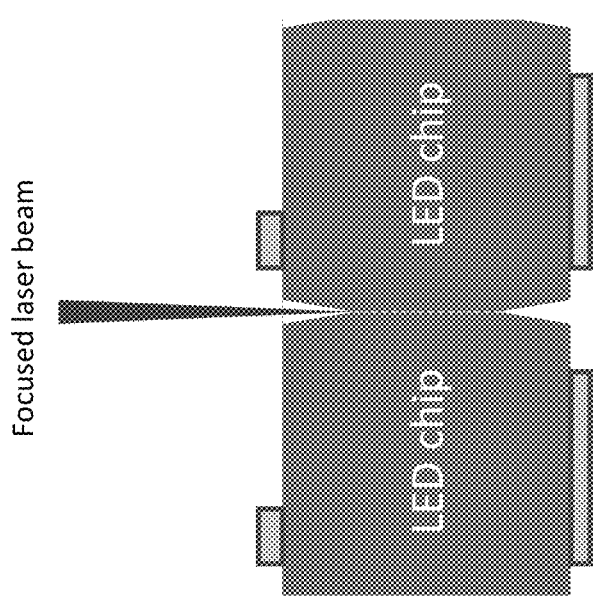
FIG. 8 is a side-view diagram depecting a laser scribing process for an optical device.

FIG. 8 is a simplified side-view diagram depicting a laser scribing process for an optical device according to an embodiment of the present invention. In a specific embodiment, the LED wafer is laser-scribed within the 'scribe streets' on a first surface of the wafer, along one or more axes according to a specific embodiment. In other embodiments, the scribing can occur using a saw, a diamond scribe, a chemical etchant (with or without a photo-assisted component), reactive ion or plasma etchant or milling, or combinations, and the like. The scribe depth in the scribed regions on the first surface is typically 20-50% of the thickness of the LED wafer according to a specific embodiment. In other embodiments, the scribe depth can vary and have other dimension.

In a specific embodiment, the LED wafer is then flipped over, and is then laser-scribed within the 'scribe streets' on a second surface of the wafer, along one or more axes, taking care to ensure that the scribes on the second surface are aligned to be substantially overlying the scribes on the first side of the wafer. In a specific embodiment, the scribe depth in the scribed regions on the second surface is typically 20-50% of the thickness of the LED wafer The scribed LED wafer is then broken using an anvil breaker setup, such as the one further described below.

Figure 9:
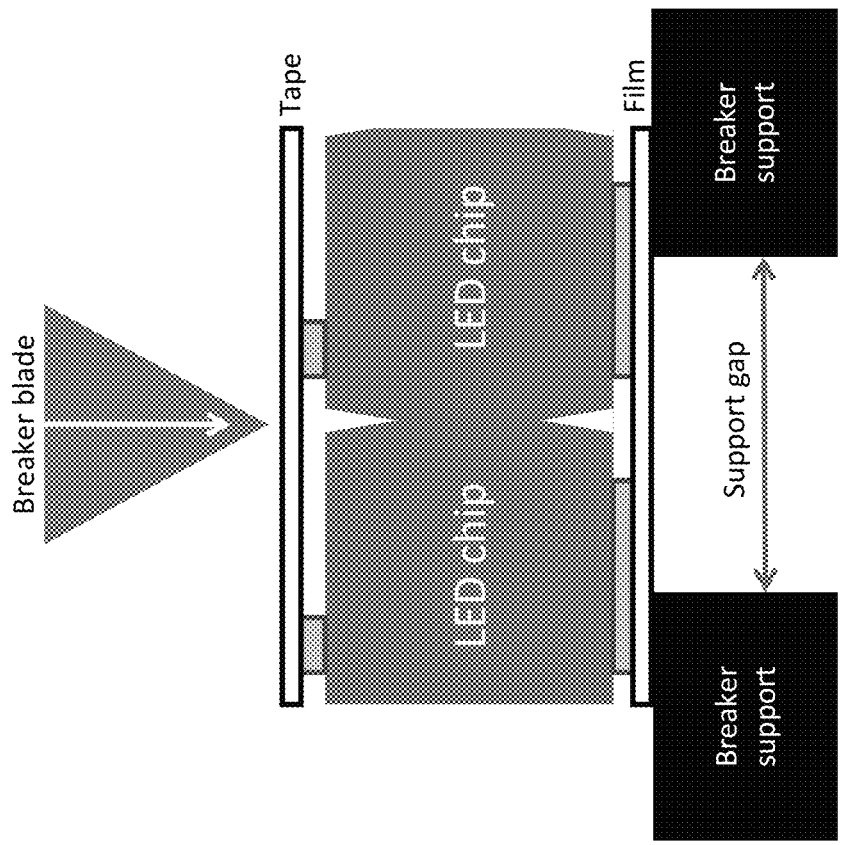
FIG. 9 is a side-view diagram depecting a breaking process for an optical device.

FIG. 9 is a simplified side-view diagram depicting a breaking process for an optical device according to an embodiment of the present invention. As shown, breaking occurs along the planes defined by two aligned scribed regions on the two opposing sides of the wafer. In a specific embodiment, the present method provides for the singulation of thick GaN wafers, thereby eliminating the need for expensive and time-consuming lapping and polishing steps in the LED fabrication process.

Figure 10:
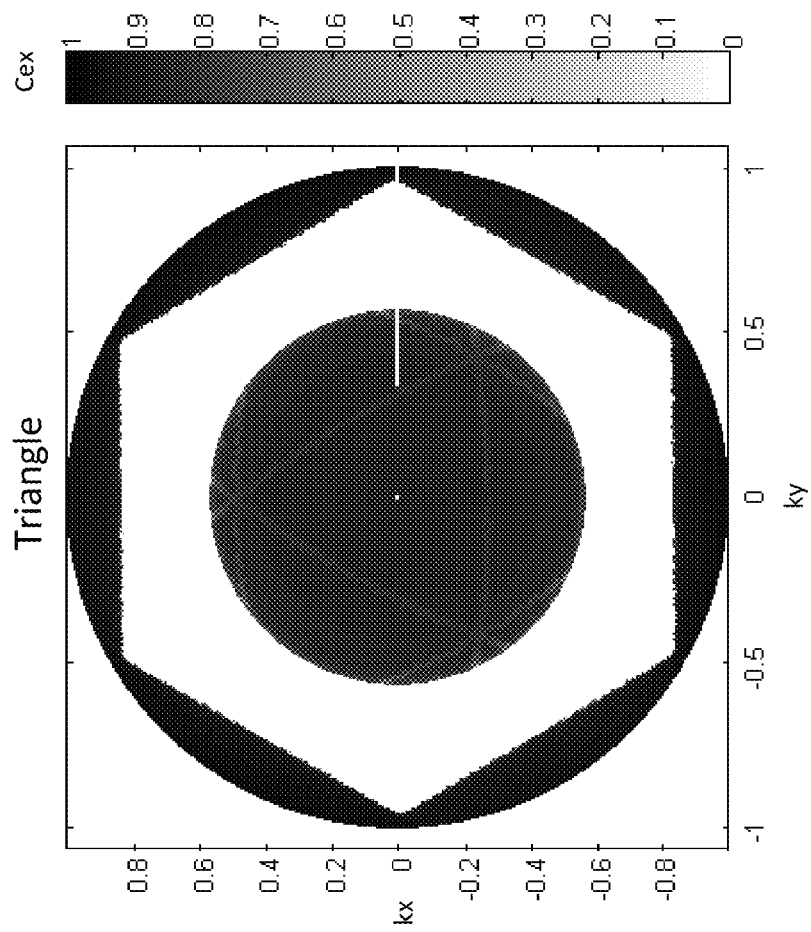
FIG. 10 is the light extraction diagram obtained from modeling light extraction in a square and a triangular chip.
Figure 10:
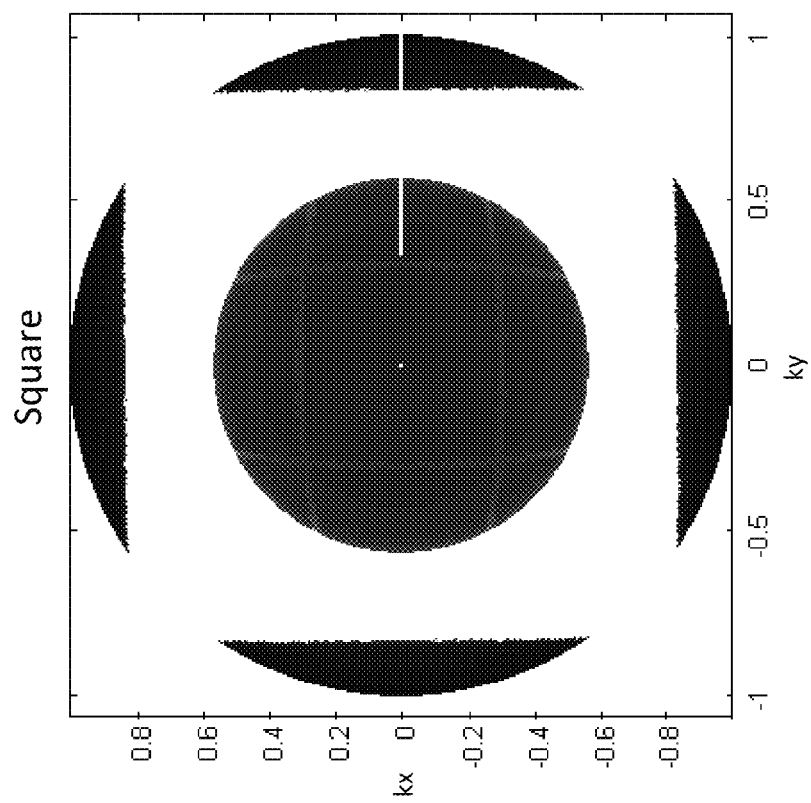

FIG. 10 displays modeling results which compare the light extraction efficiency Cex of square and triangular chips. The simulation yields the light extraction diagram, e.g. the extraction efficiency versus the direction of emission of photons (kx,ky). As can be seen, square chips offer 5 extraction cones (one per face) yielding Cex=46%. Triangular chips offer 7 extraction cones (each vertical sidewall can extract in-plane light directly or after a bounce off another sidewall) yielding Cex=57%. These numbers pertain to realistic structures (including loss in the metals and GaN substrate) and do not integrated any surface roughening of the chip walls.

Figure 11:
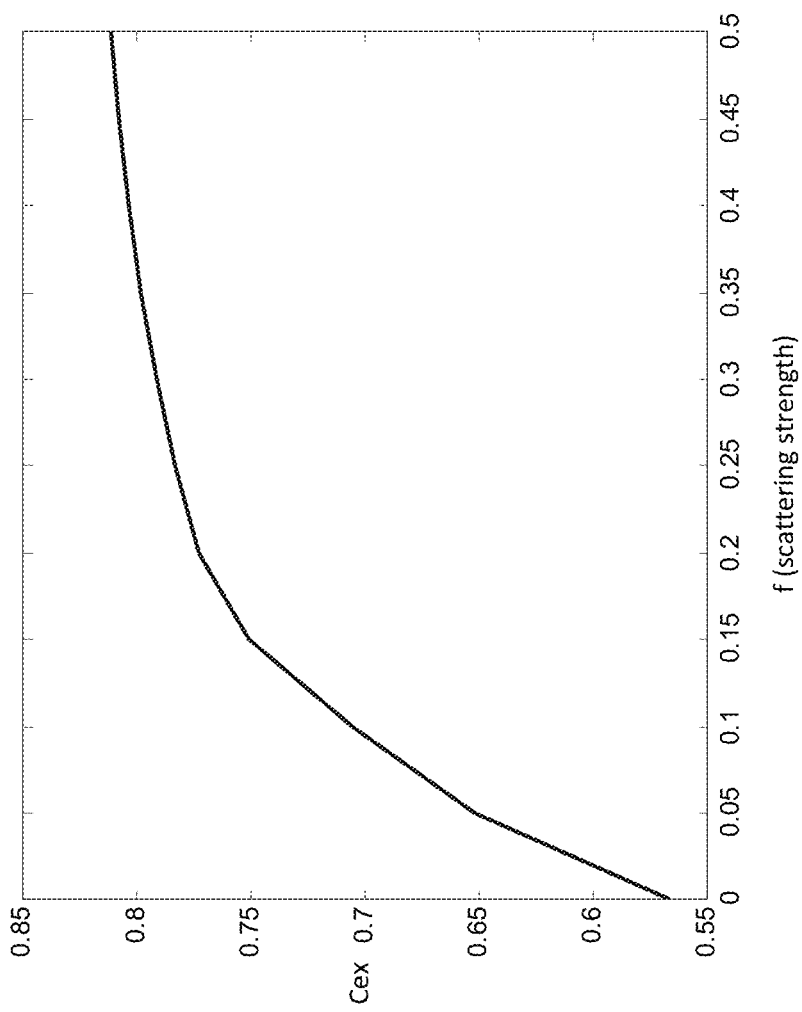
FIG. 11 is a simulation of light extraction efficiency of a triangular chip as a function of sidewall surface roughening.

FIG. 11 illustrates the impact of sidewall roughening on light extraction efficiency, as predicted by modeling. For efficient sidewall roughness, the light extraction efficiency of a triangular chip can exceed 80% (versus 57% for smooth sidewalls).

In a specific embodiment, the present method provides for the singulation of thick GaN wafers into individual LED chips with lateral chip dimensions that are significantly smaller than those enabled by standard single-sided scribe methods. In other embodiments, the present method provides higher process yields at the scribe and break process steps than conventional methods. Additionally, there is a reduced incidence of chip-outs, as well as doublets (pairs of chips that are not separated during the break step). In other embodiments, the scribed regions may induce surface roughening on the side-walls of the generated LED chips which may enhance light extraction from the chips when compared to chips generated by scribing on a single side.

In other embodiments, the present method can also include other variations, combinations, and modifications, as described below.

1. The LED wafer may be a c-plane GaN wafer
2. An individual LED wafer may be scribed on at least one of the two surfaces using at least one of a plurality of scribe methods in other embodiments. The scribe methods may include at least two or more methods selected from laser scribing, diamond scribing, and sawing/dicing.
3. In a specific embodiment, the scribe depth on any one side of the LED wafer may be varied between 0.5% and 99.5% of the thickness of the LED wafer.
4. In an alternative embodiment, the scribed regions may have continuous scribe lines, or may comprise of dashed or dotted scribe lines. The scribed regions along two or more axes may or may not intersect in the regions defined by intersecting 'scribe streets,' by design according to a specific embodiment.
5. Also, scribing may be performed along at least one 'scribe street' orientation on a first surface, and along at least one 'scribe street' orientation on the second surface, such that at least two 'scribe street' orientations chosen are non-parallel according to a specific embodiment.
6. The scribed LED wafer may be broken using a method or a plurality of methods chosen from a group including anvil breaker, roller breaker or breaker bar, combinations, and the like.

While the above is a full description of the specific embodiments, various modifications, alternative constructions and equivalents may be used. The present specification describes one or more specific gallium and nitrogen containing surface orientations, but it would be recognized that any one of a plurality of family of plane orientations can be used. The above description and illustrations should not be taken as limiting the scope of the present invention which is defined by the appended claims.

What is claimed is:
1. A lamp comprising:
   an light emitting diode (LED) device comprising at least:
      a gallium and nitrogen containing substrate having first, second, and third a-planes forming an equilateral triangle;

a light-emitting epitaxial structure overlying said substrate;
p-type metallized contact; and
an n-type metallized contact;
wherein said LED device comprises no more than five sides, wherein three sides of said five sides are along said first, second and third a-planes; and the remaining two sides of said five sides have a triangular shape and are configured from equivalent crystal planes.

2. The lamp of claim 1, wherein the two sides are in parallel to each other.

3. The lamp of claim 1, wherein at least one of the three surfaces is roughened.

4. The lamp of claim 1, wherein said substrate comprises bulk GaN.

5. The lamp of claim 1, wherein said equivalent crystal planes are c-planes.

6. The lamp of claim 1, wherein said first, second and third sides are cleaved sides.

7. The lamp of claim 6, wherein said first, second and third sides have striations along said a-planes.

8. The lamp of claim 7, wherein said striations are perpendicular to said fourth and fifth sides.

9. The lamp of claim 1, wherein said optical device has only five sides.

10. A light emitting diode (LED) device comprising:
a gallium and nitrogen containing substrate having first, second, and third a-planes forming a triangle; and
a light-emitting epitaxial structure overlying said substrate;
a p-type metallized contact; and
n-type metallized contact;
wherein said LED device comprises no more than five sides, wherein three of said five sides are along said first, second, and third a-planes, and the remaining two sides of said five sides have a triangular shape and are configured from equivalent crystal planes.

11. The LED device of claim 10, wherein the equivalent crystal planes are c-planes.

12. The LED device of claim 10, wherein the three surface regions are configured from respective scribes provided within a vicinity of respective a-planes.

13. The LED device of claim 10, wherein the two surfaces are parallel to each other.

14. The LED of claim 10, wherein at least one of the three surfaces is roughened.

15. The LED device of claim 10, wherein said substrate comprises bulk GaN.

16. The LED device of claim 15, wherein said light-emitting epitaxial structure comprises GaN.

17. The LED device of claim 10, wherein said first, second and third sides are cleaved sides.

18. The LED device of claim 17, wherein said first, second and third sides have striations along said a-planes.

19. The LED device of claim 18, wherein said striations are perpendicular to said fourth and fifth sides.

20. The LED device of claim 10, wherein said optical device has only five sides.

21. A lamp comprising:
an optical device comprising at least:
a gallium and nitrogen containing substrate having first, second, and third a-planes forming an equilateral triangle; and
a light-emitting epitaxial structure overlying said substrate;
wherein said optical device comprises no more than five sides, wherein three sides of said five sides are along said first, second and third a-planes; and the remaining two sides of said five sides have a triangular shape and are configured from equivalent crystal planes, wherein said first, second and third sides are sufficiently rough to achieve a light extraction efficiency of over 80%.

22. An optical device comprising:
a gallium and nitrogen containing substrate having first, second and third a-planes forming a triangle; and
a light-emitting epitaxial structure overlying said substrate;
wherein said optical device comprises no more than five sides, wherein three of said five sides are along said first, second, and third a-planes, and the remaining two sides of said five sides have a triangular shape and are configured from equivalent crystal planes, wherein said first, second and third sides are sufficiently rough to achieve a light extraction efficiency of over 80%.

* * * * *